United States Patent
McKittrick et al.

(10) Patent No.: US 10,635,140 B1
(45) Date of Patent: Apr. 28, 2020

(54) INFORMATION HANDLING SYSTEM ASYNCHRONOUS RETRACTABLE HINGE FULCRUM

(71) Applicant: Dell Products L.P., Round Rock, TX (US)

(72) Inventors: Allen B. McKittrick, Cedar Park, TX (US); Chung Jen Ho, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/220,679

(22) Filed: Dec. 14, 2018

(51) Int. Cl.
*G06F 1/16* (2006.01)
*H05K 5/02* (2006.01)

(52) U.S. Cl.
CPC .......... *G06F 1/1681* (2013.01); *G06F 1/1618* (2013.01); *G06F 1/1683* (2013.01); *H05K 5/0226* (2013.01)

(58) Field of Classification Search
CPC ............................. G06F 1/166; G06F 1/1675
USPC ................................................... 361/679.59
See application file for complete search history.

(56) References Cited

U.S. PATENT DOCUMENTS

| | | | |
|---|---|---|---|
| 6,380,930 B1 | 4/2002 | Van Ruymbeke | |
| 6,473,296 B2* | 10/2002 | Amemiya | G06F 1/1616 292/148 |
| 6,765,536 B2 | 7/2004 | Phillips et al. | |
| 7,926,781 B2* | 4/2011 | Wang | G06F 1/1616 248/351 |
| 9,354,669 B2* | 5/2016 | Chen | G06F 1/1681 |
| 9,740,253 B2* | 8/2017 | Cheng | G06F 1/203 |
| 9,933,813 B2* | 4/2018 | Ohishi | G06F 1/1618 |
| 10,429,885 B1* | 10/2019 | Shaw | G06F 1/1618 |
| 2008/0062065 A1 | 3/2008 | Yamamoto et al. | |
| 2010/0112833 A1 | 5/2010 | Jeon | |
| 2014/0139980 A1* | 5/2014 | Horii | G06F 1/1616 361/679.01 |
| 2015/0227168 A1* | 8/2015 | Nakamura | G06F 1/1616 361/679.55 |
| 2016/0054761 A1* | 2/2016 | Wolff | E05D 7/10 361/679.09 |

(Continued)

OTHER PUBLICATIONS

Semtech, "Semtech SX9306 Ultra Low Power SAR Proximity Sensor," downloaded from https://www.mouser.com/new/semtech/semtech-sx9306-sar-sensor/ on Dec. 13, 2018, 2 pages.

(Continued)

*Primary Examiner* — Anthony Q Edwards
(74) *Attorney, Agent, or Firm* — Zagorin Cave LLP; Robert W. Holland

(57) ABSTRACT

A portable information handling system rotationally couples first and second housing portions with a dual axle sequential hinge. Over a predetermined rotational orientation of one axle, a cam integrated with the axle engages a fulcrum biased into the hinge so that the fulcrum extends out of the hinge to support the information handling system at a support surface. For instance, before rotation of a lid housing portion relative to a main housing portion brings the lid housing portion into contact with the support surface, the fulcrum extends towards the support surface to raise the main housing portion and lid housing portion away from the support surface.

20 Claims, 8 Drawing Sheets

(56) References Cited

U.S. PATENT DOCUMENTS

2016/0083988 A1* 3/2016 Hsu ................ G06F 1/1681
 361/679.01
2017/0269638 A1* 9/2017 Chen ............... G06F 1/1616

OTHER PUBLICATIONS

Toit, R., "Using proximity sensing to meet mobile device FCC SAR regulations," Apr. 17, 2012, downloaded from https://www.embedded.com/design/connectivity/4371201/1/Using-proximity-sensing-to-meet-mobile-device-FCC-SAR-regulations, 4 pages.

* cited by examiner

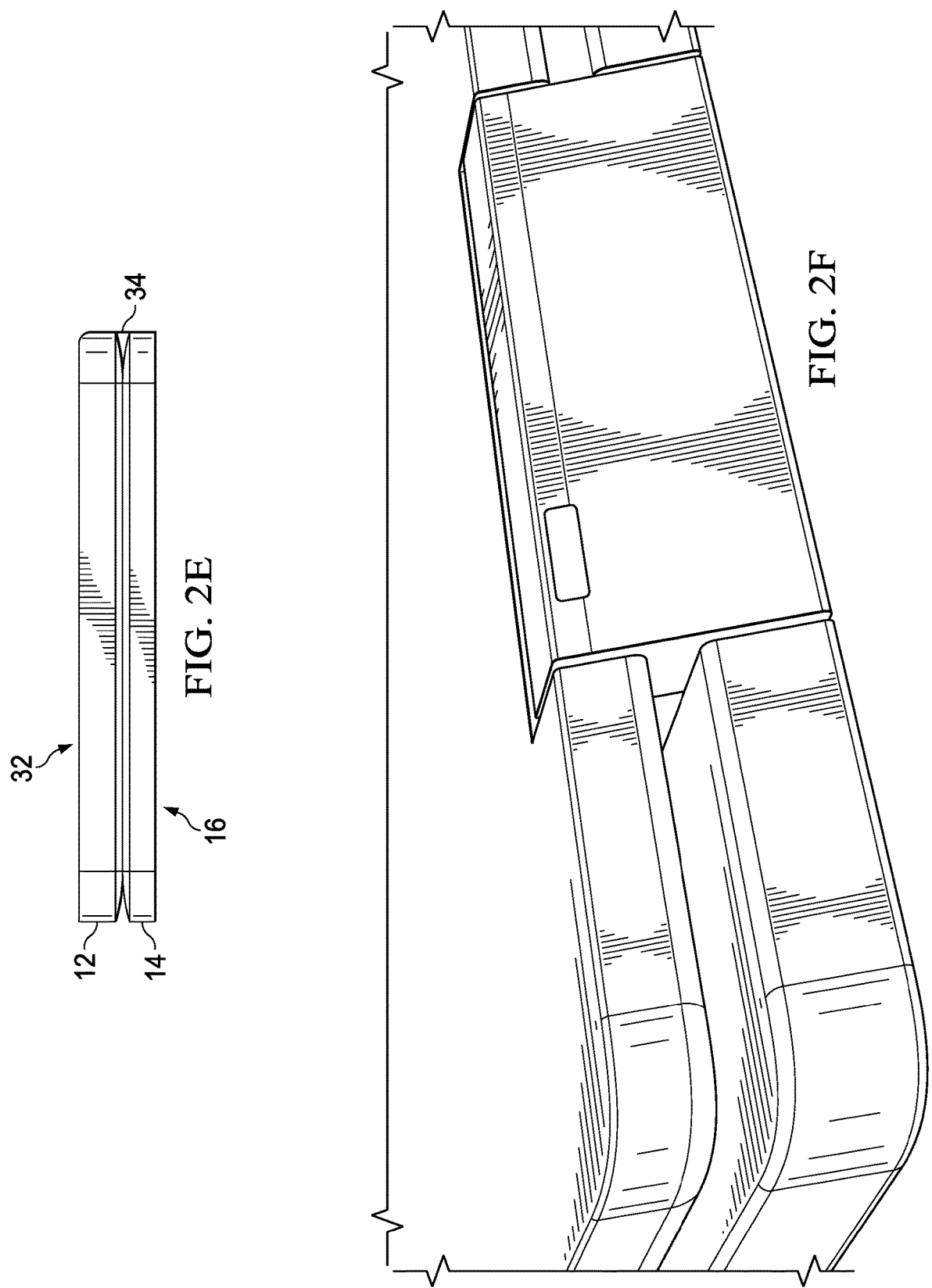

INFORMATION HANDLING SYSTEM ASYNCHRONOUS RETRACTABLE HINGE FULCRUM

BACKGROUND OF THE INVENTION

Field of the Invention

The present invention relates in general to the field of portable information handling systems, and more particularly to an information handling system asynchronous retractable hinge fulcrum.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems generally integrate processing components, input/output (I/O) devices and a power source in a portable housing to support end user interactions free from external cables and peripherals, such as a power adapter and display. Generally, portable information handling system length and width size dimensions are driven by the size of a display device integrated in the housing to present information as visual images. For instance, typically a touchscreen display integrates in one side of the housing with a bezel or other mounting structure around its perimeter to hold the touchscreen display in place. In tablet information handling systems, the touchscreen display provides the primary input device for the system by accepting touches as inputs to user interfaces, such as a keyboard. In contrast, convertible information handling systems generally include a keyboard that accepts typed inputs from an end user. Typically the keyboard and display are integrated in separate housing portions rotationally coupled together by a hinge. Convertible information handling systems generally rotate from a closed position having the display closed over the keyboard to an open position that exposes the display and keyboard. For instance, in a clamshell mode the display rotates approximately 90 degrees relative to the keyboard so that the display is held in a viewing position over the keyboard. Further rotation of the display relative to the keyboard by 180 or 360 degrees improves access to the touchscreen display so that an end user can use the touchscreen in a tablet mode.

To minimize housing dimensions, manufacturers generally attempt to mount a display in a housing with a minimal bezel area. Reducing the bezel area extends the display towards the housing perimeter to make more efficient use of an available housing footprint. One way to accomplish reduced bezel size is to create a narrow bezel around three sides of the display with an increased bezel at one side that provides room for routing data and power connections to the display. In a convertible information handling system, the side of the display proximate the hinge typically provides room for routing cables and is thus generally the side selected to support a larger bezel area. One option for achieving a narrow bezel appearance along the bottom side of the housing is to rotationally couple the housing portions with an asynchronous sequential hinge that rotates from the closed position first about the axle of the keyboard housing portion. The effect of single axle rotation at an axis proximate the keyboard housing portion is to lower the display housing portion below the keyboard housing portion at 90 degrees of rotation, thus effectively hiding the bezel area at the bottom of the display behind the keyboard housing portion. To rotate to a tablet mode, after 180 degrees of rotation about the first axle, the hinge sequences to rotate about a second axle of the display housing portion.

One difficulty with using an asynchronous sequential hinge to rotationally couple a display housing portion to a keyboard housing portion is that after 90 degrees of rotation the display housing portion has a lower relative position than the keyboard housing portion. Thus, for instance, if the keyboard housing portion rests on a support surface, after approximately 90 degrees of rotation the display housing portion will lift the keyboard housing portion up and off of the support surface. Once the keyboard housing portion lifts off the support surface, the display housing portion typically has a secondary high friction fulcrum to provide mechanical stability to the system, such as a protruding rubber component that rests against the support surface. Conventional secondary fulcrum designs result in a protruding rubber component which increases system size, adds reliability risk and negates a clean industrial design appearance. Generally, these disadvantages result from designing around an adhesive area adequate enough to ensure minimal bonding strengths that will withstand forces generated by fulcrum interactions with a support surface.

SUMMARY OF THE INVENTION

Therefore, a need has arisen for a system and method which supports an information handling system housing against a support surface during engagement by the housing about an asynchronous sequential hinge.

In accordance with the present invention, a system and method are provided which substantially reduce the disadvantages and problems associated with previous methods and systems for supporting a housing against a support surface during engagement about an asynchronous sequential hinge. A hinge axle that rotates as the display housing portion nears the support surface integrates a cam that comes into alignment with a fulcrum so that the cam forces the fulcrum to extend out of the hinge and engage with the support surface. The fulcrum withdraws as the housing portions rotate towards a flat and/or tablet position or towards a closed position that moves the display housing portion away from the support surface.

More specifically, a portable information handling system rotationally couples first and second housing portions with a dual axis hinge that sequences rotation about a first axle and then a second axle. One of the axles integrates a cam that rotates with the axle to align with a fulcrum over a predetermined range of rotational orientation. As the housing portions rotate about the axle, the axle aligns the cam with the fulcrum to extend the fulcrum outward from the hinge and towards a support surface. The fulcrum extends to support the information handling system during rotational positions in which the housing portion above a support surface rotates below the plane of the housing portion on the support surface. As rotation of the housing portions continues towards a flat position, the axle rotates the cam away from the fulcrum so that a biasing mechanism, such as spring, retracts the fulcrum into the hinge. For instance, the fulcrum extends as a lid housing portion that integrates a display rotates from a closed position towards a clamshell position at approximately 90 degrees of rotation. From 90 degrees of rotation to approaching 180 degrees of rotation the fulcrum extends towards the support surface to support the lid housing portion above the support surface. As rotation continues towards the tablet position and sequences to the other hinge axle, the fulcrum retracts to avoid interference with usage of the information handling system in the tablet position.

The present invention provides a number of important technical advantages. One example of an important technical advantage is that a portable information handling system supports rotation about an asynchronous hinge by selectively extending and retracting a fulcrum at a housing portion as needed to engage the support surface. A fulcrum that extends from and is supported by the asynchronous hinge may have a reduced size relative to fulcrums that attach with adhesive. For example, the fulcrum may attach across a surface within a hinge structure that exceeds the size of the extension area so that the hinge structure offers additional strength for a robust contact location. Relating fulcrum extension and retraction to asynchronous hinge rotational position provides fulcrum support when needed in a minimalist manner having the fulcrum hidden when not needed.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 2A through 2F depict side views of the information handling system having various rotational orientations and fulcrum extensions;

DETAILED DESCRIPTION

A portable information handling system rotationally coupled by an asynchronous hinge selectively extends and retracts a fulcrum to support housing portion interaction with a support surface based upon relative rotational position. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
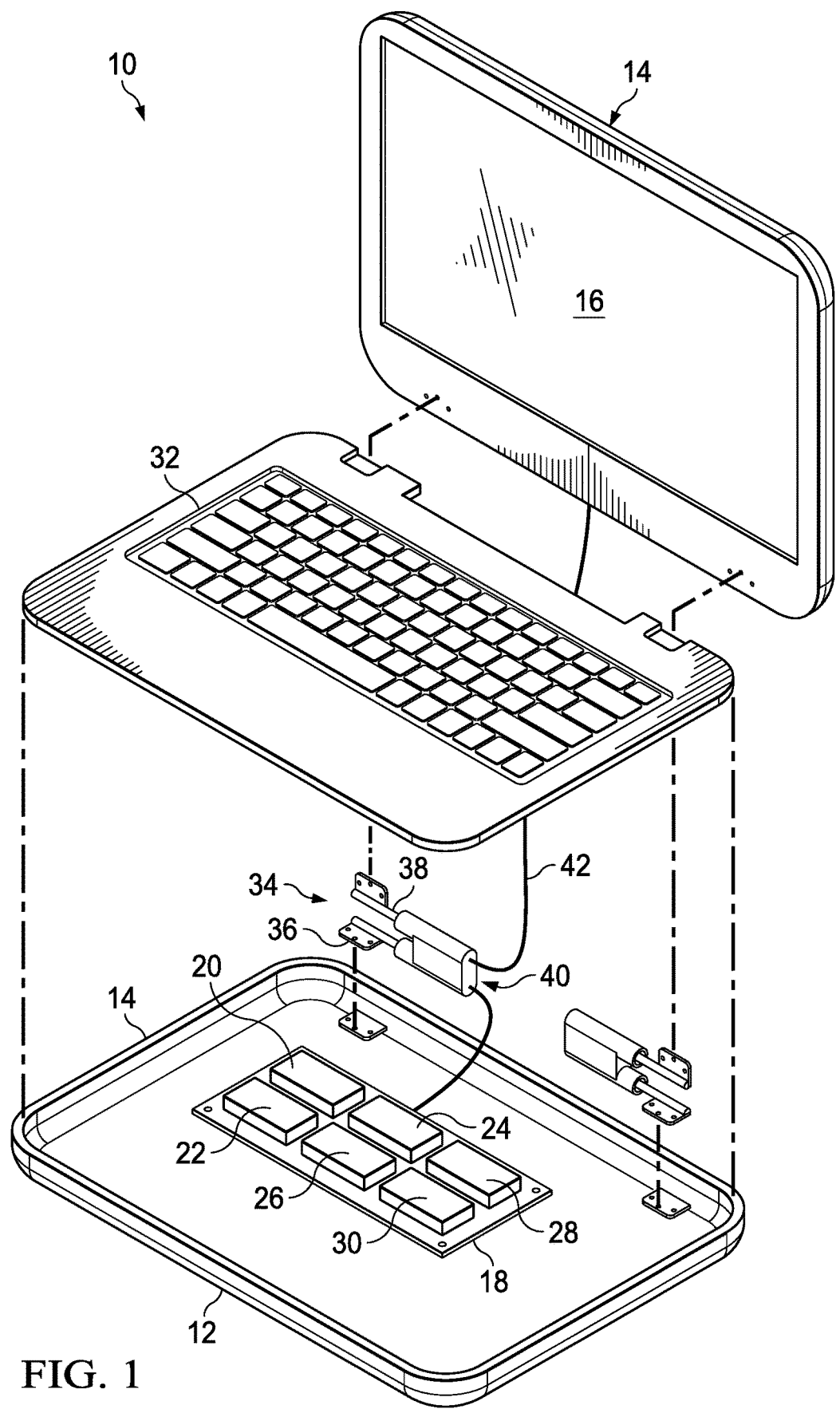
FIG. 1 depicts an exploded view of an information handling system having rotationally coupled housing portions supported by selective extension of a fulcrum.

Referring now to FIG. 1, an exploded view depicts an information handling system 10 having rotationally coupled housing portions 12 and 14 supported by selective extension of a fulcrum. In the example embodiment, information handling system 10 processes information with processing components disposed in a main housing portion 12 and presents the information as visual images at a display 16 integrated in a lid housing portion 14. For example, the processing components include a central processing unit (CPU) 20 interfaced with random access memory (RAM) 22 through a motherboard 18 that cooperate to execute instructions that process information. A chipset 24 interfaces with CPU 20 through motherboard 18 to manage CPU operations, such as communications with other processing components and clock operations. An embedded controller 26 interfaces with CPU 20 to manage power and communication with input/output devices. A graphics processor unit (GPU) 28 processes information provided from CPU 20 to generate visual information formatted for presentation at display 16, such as by generating pixel values that define a visual image. A solid state drive (SSD) 30 or other persistent storage device stores an operating system and applications executed by CPU 20. For instance, upon application of power, embedded controller 26 executes per-boot code stored in flash memory to call an operating system from SSD 30 to CPU 20 that coordinates interactions by CPU 20 with other processing components and peripheral devices. In various embodiments other types of processing components and configurations may be included in information handling system 10, such as for network communication and to support peripheral devices.

In the example embodiment, display 16 integrates in lid housing portion 14 to present visual information and a keyboard 32 couples over the processing components disposed in main housing portion 12 to protect the processing components and accept end user key inputs for communication to CPU 20 by embedded controller 26. A pair of hinges 34 couple at opposing sides of the housing portions to support rotation of lid housing portion 14 relative to main housing portion 12. For example, a pair of brackets 36 of each hinge 34 couple to main housing portion 12 and lid housing portion 14. Hinge 34 has dual parallel spaced axles 38 interfaced with a sequencer 40 to support dual axes motion of lid housing portion 14 relative to main housing portion 12. Rotation about dual axes allows 360 degrees of rotational movement so that lid housing portion 14 can rotate between a closed position having display 16 pressed next to keyboard 32 to a tablet position having display 16 exposed on an opposite side of keyboard 32. Sequencer 40 manages an asynchronous sequential motion of the housing portions in which rotation occurs about a first axle 38 while the second axle remains stationary, such as for approximately 180 degrees, followed by rotation about the second axle while the first axle remains stationary. A cable 42 passes through hinge 34 to interface the processing components of main housing portion 12 to communicate power and information with lid housing portion 14, such as for presenting the visual information as visual images at display 16. In the example embodiment, main housing portion 12 integrates keyboard 32, however, in alternative embodiments a touchscreen display disposed over main housing portion 12 may act as an input device, such as by presenting a virtual keyboard. Similarly, display 16 may include a touchscreen to act as an input device when rotated to a tablet position as described above.

Figure 2A:
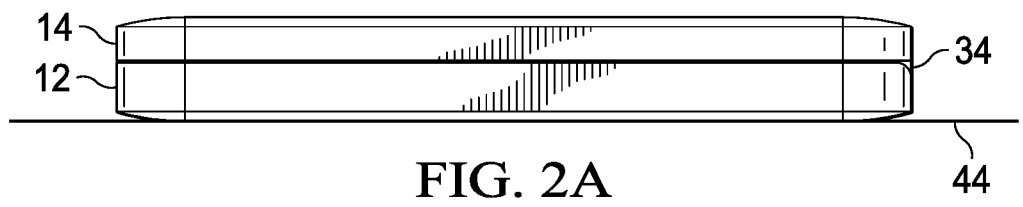
Figure 2B:
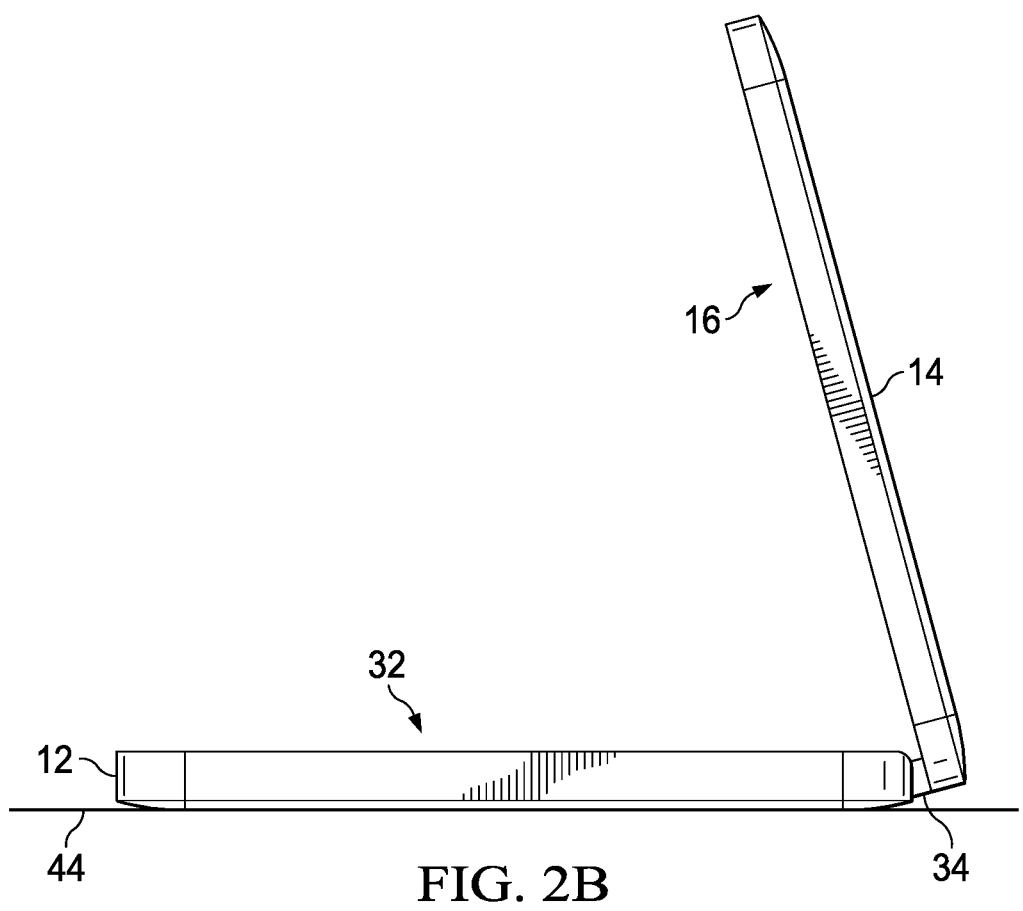

Referring now to FIGS. 2A through 2E, side views depict information handling system 10 having various rotational orientations and fulcrum 46 extensions. FIG. 2A depicts a closed position having lid housing portion 14 rotated about hinge 34 over top of main housing portion 12 so that keyboard 32 and display 16 rest proximate to each other. In the closed position, information handling system 10 is stored in a protected manner that reduces a risk of damage to display 16 and keyboard 32. The base of main housing portion 12 rests on top of a support surface 44. FIG. 2B depicts an initial rotation of lid housing portion 14 about hinge 34 by approximately 60 degrees to an open position having display 16 and keyboard 32 exposed. Hinge 34 rotates in an asynchronous manner about an axes proximate main housing portion 12 so that lid housing portion 14 remains stationary relative to hinge 34. During rotation of lid housing portion from the closed position to approximately 90 degrees open, main housing portion 12 rests on support surface 44 to hold lid housing portion 14 above support surface 44. As a result of the rotation about the axes proximate main housing portion 12, at approximately 90 degrees of rotation lid housing portion 14 will contact support surface 44. The rotational orientation of around 90 degrees is sometimes referred to as a clamshell orientation that allows main housing portion 12 to act as a base holding display 16 in a viewing position having keyboard 32 disposed conveniently to accept end user keyed inputs.

Figure 2C:
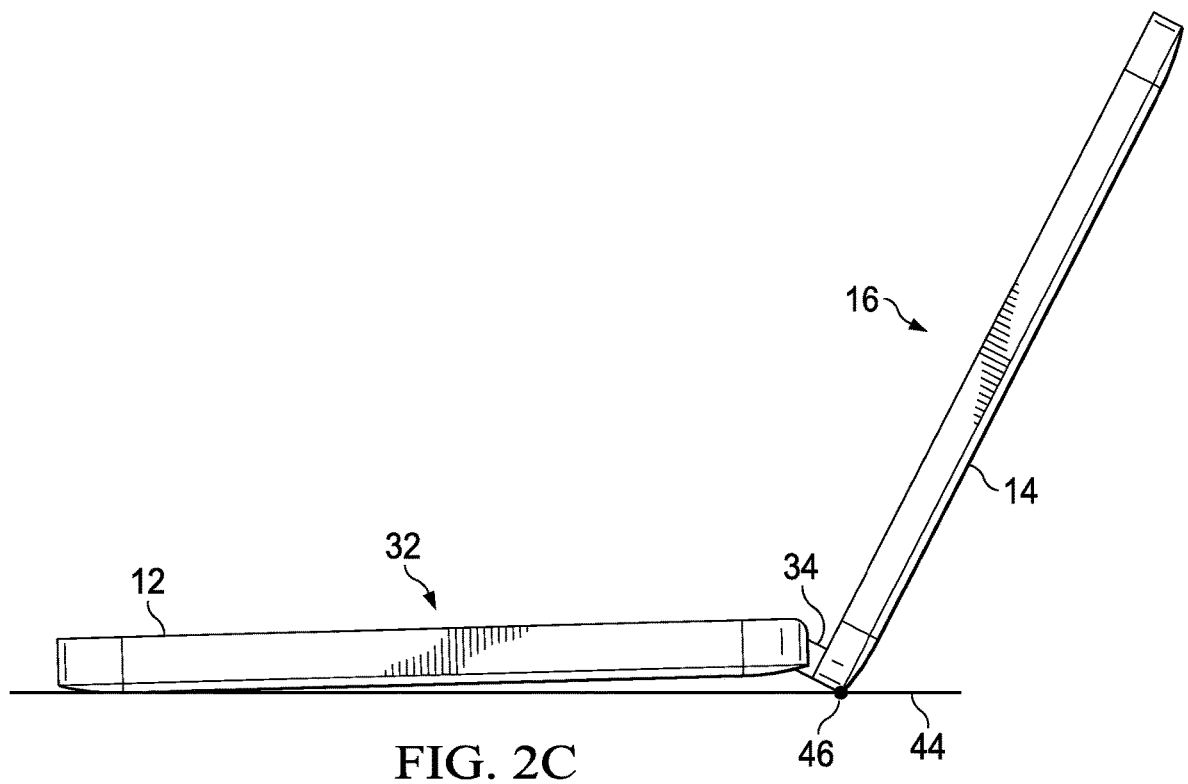
Figure 2D:
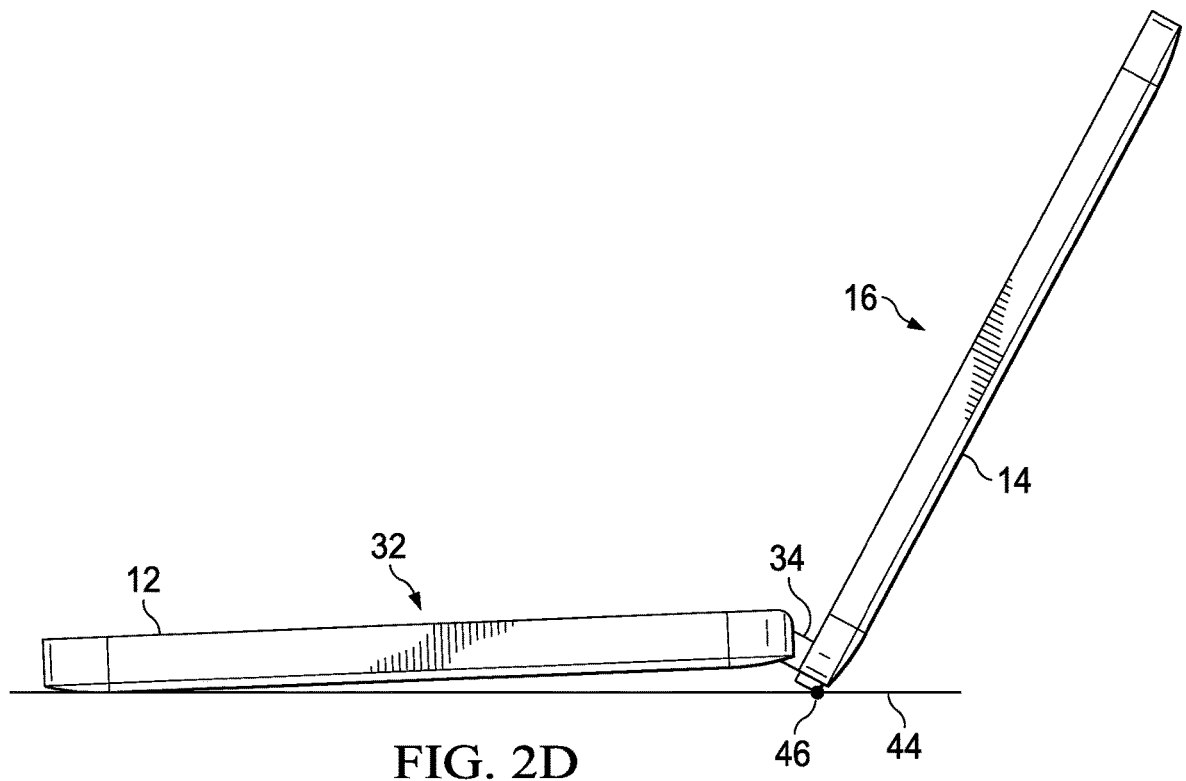

After rotation from the closed position to the clamshell position, additional rotation, such as past 90 degrees, moves lid housing portion 14 at its lowest side below a plane defined by the bottom surface of main housing portion 12 and into contact with support surface 44. FIG. 2C depicts one example embodiment of a fulcrum 46 that extends from hinge 34 towards support surface 44 to protect lid housing 14 from contact against support surface 44. For example, fulcrum 46 is a thermoplastic elastomer with a high friction coefficient that engages support surface 44 to provide stability in the positioning of information handling system 10. As lid housing portion rotates past 90 degrees of rotational orientation, the bottom surface of lid housing portion 14 presses against support surface 44 raising main housing portion 12 at the rotational axis of hinge 34 above support surface 44. Fulcrum 46 thus becomes a support point holding information handling system 10 above support surface 44. FIG. 2D depicts an alternative embodiment in which fulcrum 46 extends from hinge 34 proximate the axes of rotation at main housing portion 12. In this example embodiment, fulcrum 46 provides a vertical lift at main housing portion 12 that raises lid housing portion 14 relative to support surface 44. The amount of vertical lift may be set based upon the height of housing portions 12 and 14, the size of hinge 34, and the desired rotational orientations to support clamshell interactions by an end user. FIG. 2E depicts completion of rotation of the housing portions to a tablet position by rotating lid housing portion 14 360 degrees relative to main housing portion 12. In the tablet position, display 16 and keyboard 32 are on opposing sides of information handling system 10. Rotation from 180 to 360 degrees provides about the axes proximate to lid housing portion 14 by sequencer 40 changing the axes of rotation. Fulcrum 46 retracts into hinge 34 after 180 degrees of rotation so that it remains out of the end user's way during use in the tablet mode. During rotation from the tablet position to the closed position, fulcrum 46 extends over the rotational orientation associated with clamshell use and retracts as lid housing portion leaves contact with support surface 44. In one example embodiment, fulcrum 46 extends during a rotational orientation of 110 to 180 degrees relative to the closed position and withdraws into hinge 34 otherwise. FIG. 2E depicts a rear view of information handling system 10 having fulcrum 46 aligned with the lid housing portion axle and retracted at the closed housing position.

In various embodiments, sequencer 40 manages axle movement to achieve fulcrum extension and retraction at variable housing rotational orientations. For example, a gear or other mechanism in sequencer 40 may relate axle movements to each other. For instance, housing portions 12 and 14 may rotate separately around their respective axles so that axle movement guided by sequencer 40 aligns to extend fulcrum 46 at a stationary housing portion. As another example, sequencer 40 may shift the rotational axle at 110 degrees from rotation about the axle at the main housing portion to support a slight rotation about the lid housing portion and then return to rotation about the main housing portion. During the temporary rotation about the lid housing portion axle, movement at that axle extends fulcrum 46, which remains extended until rotation about the main housing portion axle reaches 180 degrees and rotation about the lid housing portion axle initiates to retract fulcrum 46. Alternatively, a linkage between the axles may allow one axle's movement to release fulcrum 46 at another axle. Other types of relationships may be used to mechanically extend fulcrum 46 at a first desired housing rotational orientation and retract the fulcrum at a second desired housing rotational orientation.

Figure 3A:
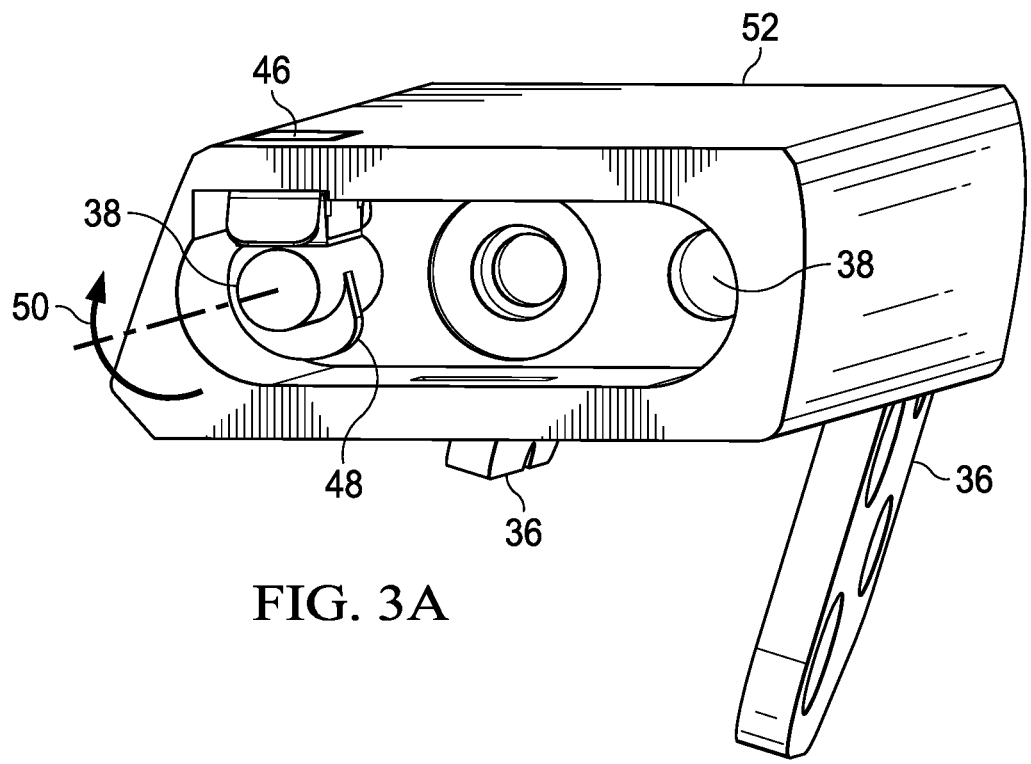
FIGS. 3A, 3B and 3C depict a side cutaway view of a dual axis hinge that selectively extends a fulcrum at a predetermined range of rotational orientations.
Figure 3B:
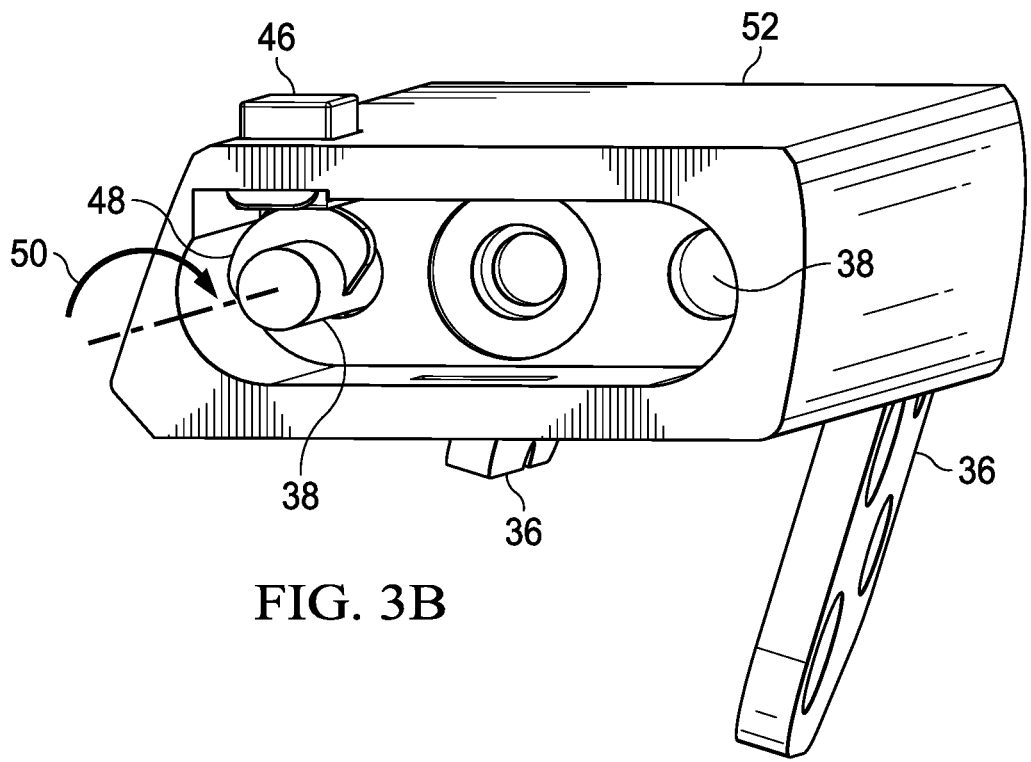
Figure 3C:
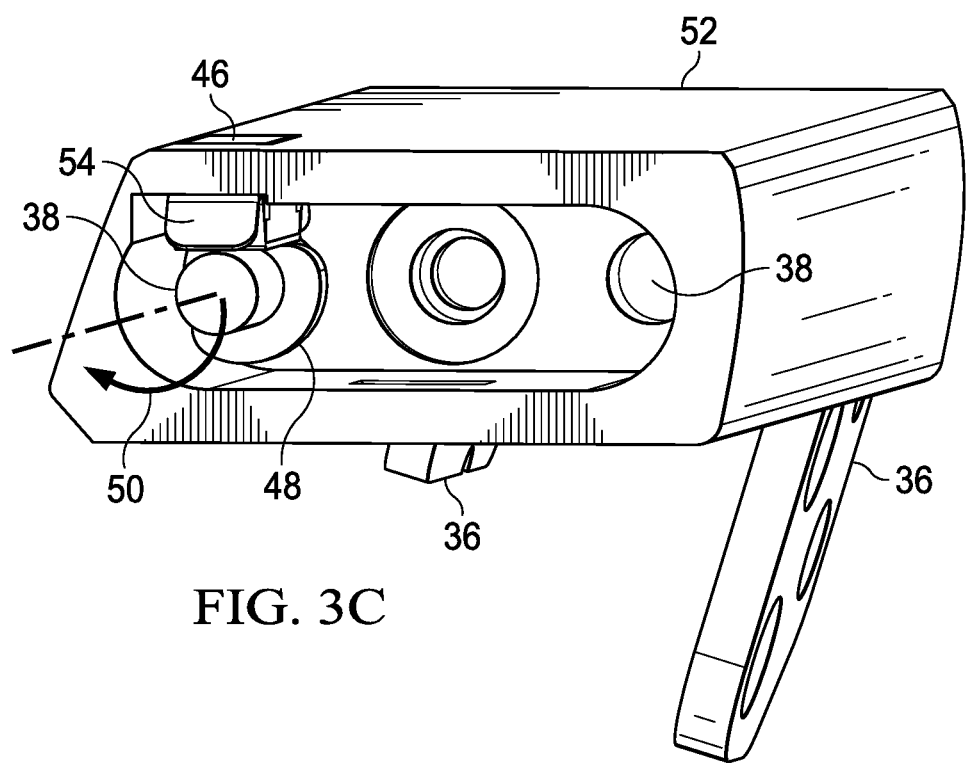

Referring now to FIGS. 3A, 3B and 3C, a side cutaway view depicts a dual axis hinge 34 that selectively extends a fulcrum 46 at a predetermined range of rotational orientations. In the example embodiment, a hinge housing 52 encloses dual axles 38 and a sequencer 40 that manages asynchronous sequential motion of axles 38. In FIG. 3A, fulcrum 46 retracts into hinge housing 52, such as due to the action of a biasing mechanism like a spring. An arrow 50 indicates rotational motion of the axle 38 that includes a cam 48 that increases the axle diameter at a predetermined orientation. In FIG. 3A, cam 48 is depicted at an initial rotational orientation of zero degrees corresponding to a closed housing position. Arrow 50 depicts a rotational orientation of from zero to 110 degrees that occurs before cam 48 contacts fulcrum 46. During this initial rotation, fulcrum 46 remains retracted within hinge housing 52 with a biasing force pressing fulcrum 46 against axle 38. The biasing force works against fulcrum 46 so that when cam 48 aligns with fulcrum 46, the greater diameter of cam 48 presses fulcrum 46 out of hinge 34. Although the example embodiment initiates extension of fulcrum 46 at 110 degrees, in alternative embodiments, a different rotational orientation may be used.

FIG. 3B depicts rotation of axle 38 to align cam 48 with fulcrum 46 so that fulcrum 46 extends outward from hinge 34. Arrow 50 depicts a rotational orientation of cam 48 that extends fulcrum 50 outward, such as between 110 and 180 degrees or rotation from the closed position. In the extended position, fulcrum 46 provides a foot of increased frictional resistance to movement than compared with the material of housing 52, such as with a rubber-type thermoplastic. As indicated by FIG. 3C, once the rotational orientation exceeds 180 degrees, cam 48 comes out of alignment with fulcrum 46 the biasing force working on fulcrum 46 forces retraction of fulcrum 46 back into hinge 34. Arrow 50 in FIG. 3C depicts that between 180 and 360 degrees of rotational orientation, fulcrum 46 remains retracted in hinge 34, thus remaining out of the way of an end user.

Figure 4:
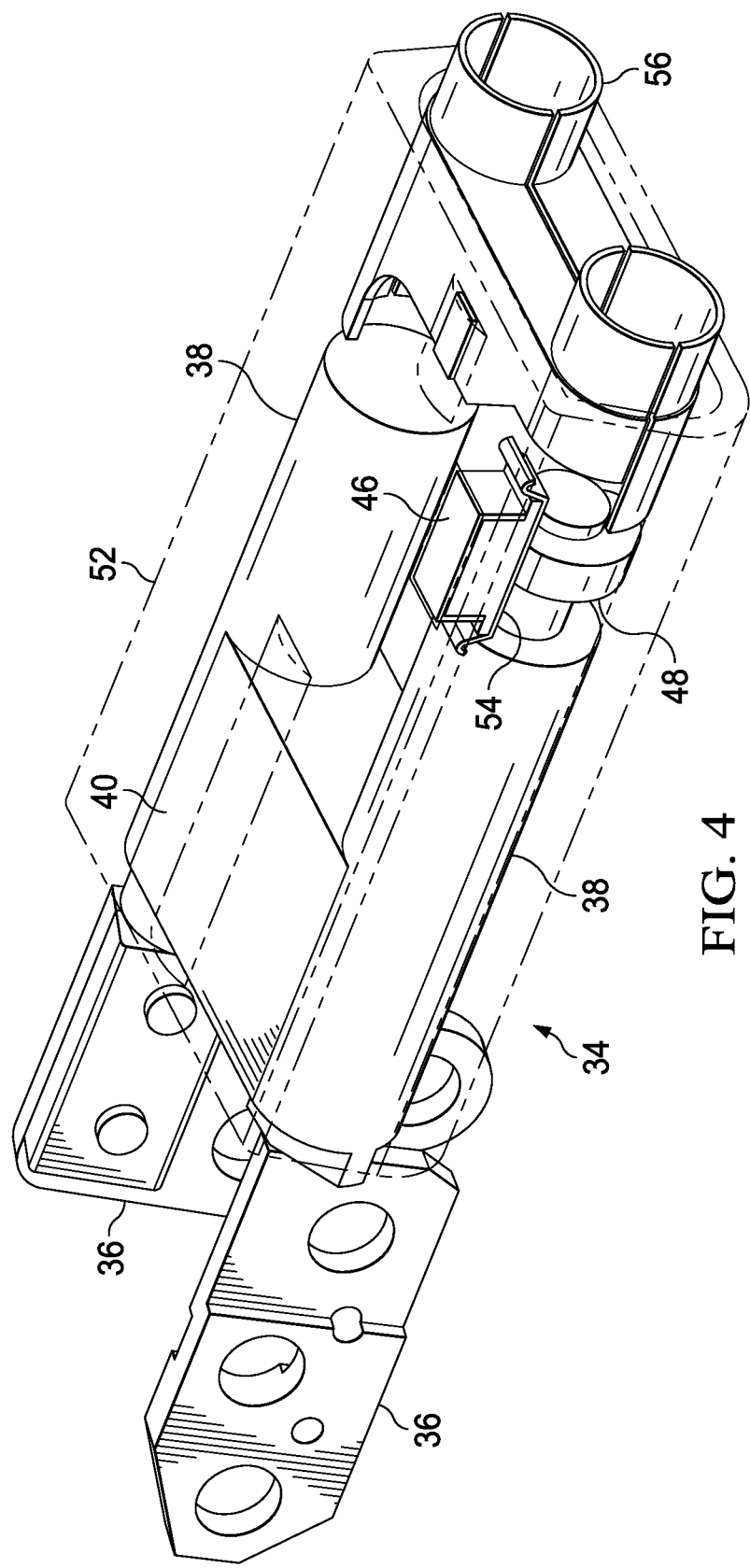
FIG. 4 depicts an upper perspective view of an asynchronous sequential hinge having a cam and fulcrum exposed.

Referring now to FIG. 4, an upper perspective view depicts an asynchronous sequential hinge 34 having a cam 48 and fulcrum 46 exposed. Hinge 34 has an outer housing 52 removed to show dual axles 38 supported by a sequencer 40. Sequence 40 manages axle 38 rotation so that cam 48 aligns with fulcrum 46 at a desired rotational orientation of the information handling system. Sequencer 40 rotates about each axle 38 in turn so that a desired housing presentation is achieved, such as by rotating the display housing portion behind the keyboard housing portion in the clamshell position to reduce visual impact of the display bezel bottom portion during use. A cable tube 56 engages over axles 38 to provide routing of cables 42 between the housing portions. In the example embodiment, cable tube 56 provides a structure to contain cam 48, such as by inserting cam 48 through an opening in cable tube 56. For example, cable tube 56 provides a platform that a spring 54 attaches to as a biasing mechanism to pull fulcrum 46 constantly toward axle 38. Inserting fulcrum 46 through an opening of cable tube 56 also provides additional security against fulcrum 46 falling out of hinge 34, such as by having a lip at the inside end of fulcrum 46 that has a larger perimeter than the cable tube opening.

Figure 5:
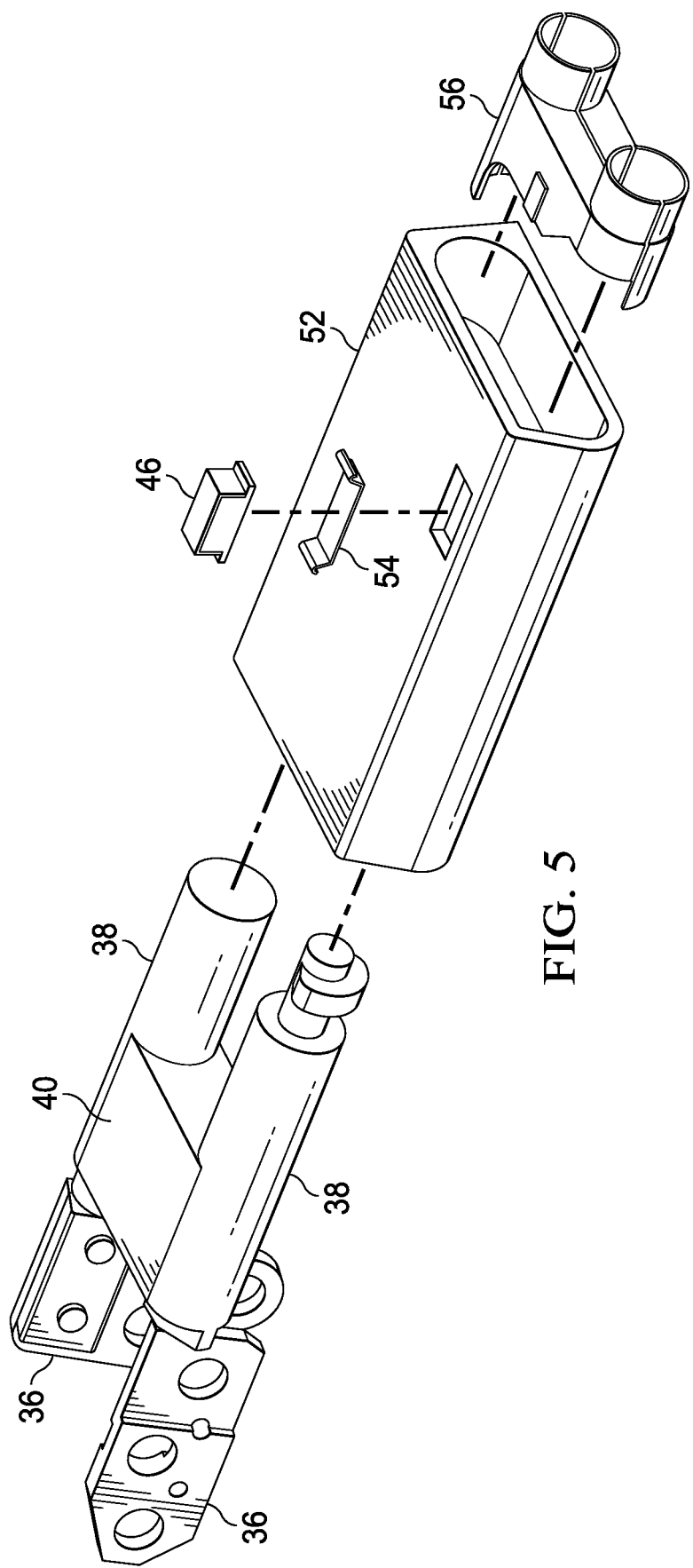
FIG. 5 depicts an exploded view of the asynchronous sequential hinge.

Referring now to FIG. 5, an exploded view depicts the asynchronous sequential hinge 34. In the example embodiment, sequencer 40 manages axle movement so that cam 48 on one of the axles aligns with fulcrum 46 at desired rotational orientations. Spring 54 provides a biasing mechanism that maintains fulcrum 46 biased against the axle 38 so that cam 48 acts to extend and retract fulcrum 46 at the predetermined rotational orientations.

Although the present invention has been described in detail, it should be understood that various changes, substitutions and alterations can be made hereto without departing from the spirit and scope of the invention as defined by the appended claims.

What is claimed is:

1. An information handling system comprising:
    a display housing portion;
    a display integrated in the display housing portion and operable to present visual information as visual images;
    a keyboard housing portion;
    processing components disposed in the keyboard housing portion and operable to generate the visual information;
    a keyboard disposed in the keyboard housing over the processing components;
    a hinge rotationally coupling the display housing portion and the keyboard housing portion, the hinge having first and second parallel axles that rotate in sequential order, at least one of the first and second axles having a cam; and
    a fulcrum biased to withdraw towards the hinge and press against the at least one of the first and second axles proximate the cam, the cam pressing the fulcrum to extend away from the hinge through a predetermined rotational orientation of the at least one of the first and second axles.

2. The information handling system of claim 1 further comprising:
    a cable guide coupled to the first and second axles, the cable guide having an opening, the fulcrum passing through the opening; and
    a cable passing through the cable guide to communicate visual information from the processing components to the display.

3. The information handling system of claim 2 further comprising a biasing mechanism interfacing cable guide and fulcrum to bias the fulcrum towards the at least one of the first and second axles.

4. The information handling system of claim 3 wherein the biasing mechanism comprises a spring coupled to the cable guide and fulcrum to pull the fulcrum towards the at least one of the first and second axles.

5. The information handling system of claim 1 wherein the fulcrum extends away from the hinge at the axle proximate the display housing portion.

6. The information handling system of claim 5 wherein the predetermined orientation comprises at least ninety degrees of rotation of the display housing portion from a closed position relative to the keyboard housing portion.

7. The information handling system of claim 6 wherein the predetermined orientation comprises not greater than 180 degrees of rotation of the display housing portion from a closed position relative to the keyboard housing portion.

8. The information handling system of claim 5 wherein the sequential order comprises rotation about the axle proximate the display housing portion for 180 degrees from a closed position to a flat position followed by rotation about the axle proximate the keyboard housing portion for 180 degrees from the flat position to a tablet position.

9. The information handling system of claim 1 wherein the fulcrum comprises a thermoplastic elastomer.

10. A method for supporting a portable information handling system on a support surface, the method comprising:
    interfacing a fulcrum with a hinge axle, the hinge rotationally coupling first and second housing portions;
    rotating the first and second housing portions about the hinge from a closed position to at least a first predetermined angle;
    aligning a cam with fulcrum at the first predetermined angle, the cam formed in a first axle of the hinge and aligned by rotation of the first axle; and
    pressing the fulcrum outward from the hinge with the cam, the fulcrum supporting the portable information handling system against the support surface.

11. The method of claim 10 further comprising:
    rotating the first and second housing portions about the hinge to at least a second predetermined angle of greater than the first predetermined angle; and
    misaligning the cam and fulcrum at the second predetermined angle, the cam biased to retract into the hinge.

12. The method of claim 11 wherein:

the first housing portion supports the information handling system on the support surface in the closed position;

the second housing portion rotates from the closed position to the second predetermined angle about only the first axle; and the first predetermined angle occurs before the second housing portion contacts the support surface.

13. The method of claim 12 wherein the second predetermined angle is substantially 180 degrees.

14. The method of claim 12 further comprising:

at greater than the second predetermined angle, rotating the first and second housing portions about only a second axle; and rotating the first and second housing portions 360 degrees to a tablet position.

15. The method of claim 14 wherein:

the hinge comprises a dual axle sequential hinge;

the first axle is proximate to the first housing portion; and the second axle is proximate to the second housing portion.

16. A hinge comprising:

a first axle having a cam;

a second axle disposed parallel to the first axle;

a sequencer coupled to the first and second axles, the sequencer rotating from a closed position to a first rotational angle about only the first axle, and rotating from the first rotational angle to a second rotational angle about only the second axle; and a fulcrum biased against the first axle proximate the cam, the cam pressing the fulcrum outward from the hinge through a predetermined rotational orientation of the first axle.

17. The hinge of claim 16 further comprising:

a cable guide coupled between the first and second axles; and a cable routed from the first axle to the second axle through the cable guide.

18. The hinge of claim 17 wherein cable guide forms an opening, the fulcrum passing through the opening.

19. The hinge of claim 16 wherein the fulcrum comprises a thermoplastic elastomer.

20. The hinge of claim 16 further comprising a biasing mechanism engaged with the fulcrum to bias the fulcrum to a retracted position when outside the predetermined rotational orientation of the first axle.

* * * * *